US006467048B1

(12) United States Patent
Olarig et al.

(10) Patent No.: US 6,467,048 B1
(45) Date of Patent: Oct. 15, 2002

(54) APPARATUS, METHOD AND SYSTEM FOR USING CACHE MEMORY AS FAIL-OVER MEMORY

(75) Inventors: Sompong P. Olarig, Cypress, TX (US); John E. Jenne, Houston, TX (US); Christopher M. Carbajal, Houston, TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/414,206

(22) Filed: Oct. 7, 1999

(51) Int. Cl.[7] .................................................. H02H 3/05
(52) U.S. Cl. ............................................ 714/7; 714/54
(58) Field of Search ................................ 714/7, 8, 5, 6, 714/54, 718; 711/104, 108, 151, 152

(56) References Cited

U.S. PATENT DOCUMENTS

| | | | | |
|---|---|---|---|---|
| 5,208,813 A | * | 5/1993 | Stallmo | 714/7 |
| 5,526,482 A | * | 6/1996 | Stallmo et al. | 714/6 |
| 5,588,110 A | * | 12/1996 | DeKoning et al. | 714/5 |
| 5,724,501 A | * | 3/1998 | Dewey et al. | 714/9 |
| 5,905,858 A | * | 5/1999 | Jeddeloh | 714/52 |
| 6,023,748 A | * | 2/2000 | Peters et al. | 711/151 |
| 6,038,680 A | * | 3/2000 | Olarig | 714/6 |
| 6,052,798 A | * | 4/2000 | Jeddeloh | 714/8 |
| 6,073,218 A | * | 6/2000 | DeKoning et al. | 711/150 |

* cited by examiner

Primary Examiner—Dieu-Minh Le
(74) Attorney, Agent, or Firm—Conley, Rose & Tayon, P.C.

(57) ABSTRACT

A computer system having a main memory and a cache memory, the computer system uses portions of the cache memory to store information from defective main memory locations until the main memory can be repaired. The address space of the main memory is always maintained by substituting cache-lines of cache memory for the defective main memory locations. A fail-over memory status bit in the cache memory controller indicates when a cache line of the cache memory contains fail-over information from the defective or failing main memory so that that cache-line will not be written over by a cache replacement algorithm. When the fail-over status bit is set, the contents of the fail-over memory location(s) remains in the cache-line and all memory reads and writes are directed to only that cache-line of the cache memory and not the main memory for the fail-over memory location(s). Also no write-back of the fail-over memory location(s) from cache memory to the main memory is required nor desired until the main memory location is repaired or replaced. Indicator lights may be used to represent the different activities of the main and cache memories at detection of the defective memory location, during and after fail-over from the main memory location to the cache-line, and transfer back to the main memory once repaired. A plurality of cache memories may migrate fail-over information therebetween.

39 Claims, 6 Drawing Sheets

APPARATUS, METHOD AND SYSTEM FOR USING CACHE MEMORY AS FAIL-OVER MEMORY

BACKGROUND OF THE INVENTION

1. Field of the Invention

The present invention relates to computer systems, and more particularly, to high availability computer systems having error detecting and correcting random access memory, at least one cache memory and a fail-over replacement system for defective portions of the random access memory.

2. Description of the Related Technology

Use of computers, especially personal computers, is becoming more and more pervasive because the computer has become an integral tool of most information workers who work in the fields of accounting, law, engineering, insurance, services, sales and the like. Rapid technological improvements in the field of computers have opened up many new applications heretofore unavailable or too expensive for the use of older technology mainframe computers. These personal computers may be used as stand-alone workstations (high end individual personal computers) or linked together in a network by a "network server" which is also a personal computer which may have a few additional features specific to its purpose in the network.

The network server may be used to store massive amounts of data, and may facilitate interaction of the individual workstations connected to the network for electronic mail ("e-mail"), document databases, video teleconferencing, whiteboarding, integrated enterprise calendar, virtual engineering design and the like. Multiple network servers may also be interconnected by local area networks ("LAN") and wide area networks ("WAN").

As users become more and more dependent on computers, the requirements for the computer system remaining operational when most needed is of paramount importance. An unplanned service outage because of a computer server crash may leave customers waiting in line at checkout counters, doctors unable to obtain patient data, on:line users unable to log onto a network; an office slowdown or even shutdown because documents, e-mail, accounting information, Internet web page hosting becoming inaccessible, etc.

The network servers are being widely used in mission critical business, scientific and government applications by, for example, tying together the personal computer workstations into a network (LAN and WAN), and for storing and/or forwarding critical information. Software applications such as databases that run on these servers are becoming more memory intensive than ever before. The memory systems of these servers are continually becoming larger in order to handle the more demanding software application programs and files associated therewith. At the same time, rapidly advancing electronics technologies enable microprocessors and associated memory devices to run at ever faster clock speeds using lower voltages. The lower voltage creates a lower data signal noise margin, and the higher clock speeds exasperate noise conditions. As a direct result, the computer system environmental noise becomes a more significant factor and data is more vulnerable to errors cause by transient electrical and electromagnetic phenomena that can corrupt the data stored in the memory subsystem.

When a memory error does occur, a server should not lose critical data or crash. A server may employ an error checking and correcting (ECC) logic circuit to improve data integrality and thus data availability by detecting and correcting "soft" data errors within the memory subsystem. Error detection and correction allows the server memory subsystem to operate continuously, and to be available as long as the detected errors are correctable by the ECC logic circuit. However, a memory address of the memory subsystem that has experienced excessive ECC soft errors is more likely to continue generating errors and the severity of these errors may increase to the point where the ECC logic circuit can no longer correct all of the errors. At the point of being unable to correct all of the errors, the server may crash.

Defective portions of a memory module(s) (i.e., having an excessive amount of errors) have been replaced or bypassed in the memory subsystem by marking the section (for example 128 KB) of faulty memory (due to excessive or non-correctable errors). Then the server would need to be shutdown and then restarted, without the section of faulty memory mapped into the computer system address space, thus, a network outage is required and a subsequent reduction in system memory capacity results.

Fully redundant memory subsystems may be used and when excessive errors occur in one it is marked as defective. When the server is restarted the defective memory is not mapped as useable memory, however, half of the system memory is no longer functional and system performance suffers.

A standby hot fail-over memory system allows the memory controller to fail-over to a standby memory module the data stored in the memory module having errors before an uncorrectable error happens. This fail-over system, however, allows only one memory module to be replaced. It cannot solve the problem of errors coming from multiple memory modules. An additional memory module must be designated as the standby memory module. It takes a longer time for the fail-over process to complete since all of the data stored in the failing memory module must be transferred to the standby memory module. The fail-over time is dependant upon the memory size and the actual memory traffic that is generated during the fail-over process. The standby hot fail-over memory system is more fully described in commonly owned U.S. patent application Ser. No. 08/763,411, filed Dec. 11, 1996, entitled "Failover Memory for a Computer System" by Sompong P. Olarig, and is incorporated by reference herein.

A fast fail-over memory allows the memory controller to support multiple memory address failures while the computer system is running before an uncorrectable error occurs. The fast fail-over memory system requires a portion of additional standby memory space to function. If there are no memory errors, the fail-over standby memory is not being used. The fast fail-over memory system is more fully described in commonly owned U.S. patent application Ser. No. 09/116,714, filed Jul. 16, 1998, entitled "Fail-Over of Multiple Memory Blocks in Multiple Memory Modules in a Computer System" by Sompong P. Olarig, and is incorporated by reference herein.

The processor or plurality of processors in a computer system run in conjunction with a high capacity, low-speed (relative to the processor speed) main memory, and a low capacity, high-speed (comparable to the main memory speed) cache memory or memories (one or more cache memories associated with each of the plurality of processors).

Cache memory is used to reduce memory access time in mainframe computers, minicomputers, and microprocessors. The cache memory provides a relatively high speed memory interposed between the slower main memory and the processor to improve effective memory access rates, thus improving the overall performance and processing speed of the computer system by decreasing the apparent amount of time required to fetch information from main memory In today's single and multi-processor computer systems, there is typically at least one level of cache memory for each of the processors. The latest microprocessor integrated circuits may have a first level cache memory located in the integrated circuit package and closely coupled with the central processing unit ("CPU") of the microprocessor. Additional levels of cache may also be implemented by adding fast static random access memory (SRAM) integrated circuits and a cache controller. Typical secondary cache size may be any where from 64 kilobytes to 8 megabytes and the cache SRAM has an access time comparable with the processor clock speed.

In common usage, the term "cache" refers to a hiding place. The name "cache memory" is an appropriate term for this high speed memory that is interposed between the processor and main memory because cache memory is hidden from the user or programmer, and thus appears to be transparent. Cache memory, serving as a fast storage buffer between the processor and main memory, is not user addressable. The user is only aware of the apparently higher-speed memory accesses because the cache memory is satisfying many of the requests instead of the slower main memory.

Cache memory is smaller than main memory because cache memory employs relatively expensive high speed memory devices, such as static random access memory ("SRAM"). Therefore, cache memory typically will not be large enough to hold all of the information needed during program execution. As a process executes, information in the cache memory must be replaced, or "overwritten" with new information from main memory that is necessary for executing the process thread. The information in main memory is typically updated each time a "dirty" cache line is evicted from the cache memory (a process called "write back"). As a result, changes made to information in cache memory will not be lost when new information enters cache memory and overwrites information which may have been changed by the processor.

Information is only temporarily stored in cache memory during execution of the process thread. When process thread data is referenced by a processor, the cache controller will determine if the required data is currently stored in the cache memory. If the required information is found in cache memory, this is referred to as a "cache hit." A cache hit allows the required information to be quickly retrieved from or modified in the high speed cache memory without having to access the much slower main memory, thus resulting in a significant savings in program execution time. When the required information is not found in the cache memory, this is referred to as a "cache miss." A cache miss indicates that the desired information must be retrieved from the relatively slow main memory and then placed into the cache memory. Cache memory updating and replacement schemes attempt to maximize the number of cache hits, and to minimize the number of cache misses.

Information from main memory is typically stored in "lines" of cache memory which contain a plurality of bytes or words from the main memory such as, for example, 16, 32 or 64 bytes of information. The plurality of bytes from main memory are stored sequentially in a line of cache memory. Each line of cache memory has an associated "tag" that stores the physical addresses of main memory containing the information in the cache line as well as other things such as "MESI" state information for the cache line. From the example above, if 16 bytes of information are stored in a cache line, the least significant 4 bits of the physical address of main memory are dropped from the main memory address stored in the tag register. In addition, the tag register may contain a cache consistency protocol such as "MESI" (Modified, Exclusive, Shared and Invalid) to ensure data consistency in a multi-processor or bus master environment.

What is needed is a system, method and apparatus for replacing failing (excessive error generating) memory locations (addresses) without requiring additional standby memory modules, or having to shutdown and restart the computer system.

SUMMARY OF THE INVENTION

The present invention overcomes the above-identified problems as well as other shortcomings and deficiencies of existing technologies by providing in a computer system an apparatus, method and system to automatically fail-over multiple blocks of failing (error prone) memory locations from one or more memory modules to cache memory while the computer system is running and without having to reboot (restart) the computer system. The memory modules may be for example but not limitation, single-in-line memory modules (SIMM), dual-in-line memory modules (DIMM), "DIRECT RAMBUS" in-line memory modules (RIMM), portable RAMBUS in-line memory modules (SO-RIMM), and the like of dynamic random access memory (DRAM). DIRECT RAMBUS, RIMM, SO-RIMM, and RAMBUS are registered trademarks of Rambus Inc., 2465 Latham Street, Mountain View, Calif. 94040, USA.

According to the embodiments of the present invention, a cache memory and a logic circuit, such as a core logic chipset, adapted for operation with the cache memory operates normally for caching data and instructions from system memory. However, when a hard memory failure or an excessive number of ECC errors has been detected, the failing memory location(s) or (address(es)) are remapped to the cache memory on a cache-line by cache-line basis. While the cache-line of memory locations or addresses having the failing memory address(es) is being remapped to the cache memory, any further requests to the failing memory (at least the cache line of such memory locations or addresses) will be stalled. Once the failing memory address(es) have been remapped to a cache-line of the cache memory, all reads from, or writes to those memory addresses remapped to the cache-line (a cache "hit") are handled from the cache memory without ever needing to access the failing memory location(s) again. The computer system continues to run normally without any significant performance loss, except that all requests to the failing memory location(s) are serviced from the cache memory. When a main memory error occurs, the computer system can notify a systems administrator of the failed memory via LEDs, LCD, GUI, a user message, and the like.

Each cache-line has status bits associated therewith that are used for cache coherency functions. The status bits follow a cache coherency protocol such as MESI. Cache memory is not large enough to hold all the data that the processor(s) need during operation of the computer system, therefore, cache-line entries are replaced when new data is brought into the cache. To ensure that a cache-line being used as fail-over memory is never replaced, an additional status bit for that cache-line is required. This status bit may be referred to hereinafter as the "fail-over memory status bit" and will be used to "lock" this cache-line of cache memory and indicate that this cache-line is being used as fail-over memory and cannot be replaced with other instructions or data, i.e., be part of a pool of cache-lines available for replacement.

During normal cache memory operation, a replacement algorithm (e.g., least recently used) may designate any cache-line for replacement (updating of instructions or data used by the processor(s) of the computer system). However, when the fail-over memory status bit is set for a corresponding cache-line, that cache-line is being used as fail-over memory and it then becomes a part of the permanent computer system memory since the so marked cache-line has effectively replaced a cache-line of main memory having a failing memory location(s). The fail-over memory status bit is set whenever a memory error has been detected and the contents of that failing memory location(s) has been remapped to the cache memory.

The cache-line replacement algorithm will read the fail-over memory status bit, and if set, will not use the associated cache-line for a subsequent replacement operation. Since cache-lines that are identified as fail-over memory cannot be replaced, all reads to those cache-line addresses will result in hits in the cache memory. All writes to those so marked cache-line addresses will also be hits, however, the set fail-over memory status bit will serve as an indication that the modified contents of the cache-line need not be written to main memory (failed memory). Snarfing and snooping from other controllers of the computer system will still function by reading the modified contents of the cache-line but there will be no writeback or eviction of the cache-line so long as the fail-over memory status bit remains set.

Once the main memory with the hard failure or excessive ECC errors has been replaced (for example during a hot plug replacement), the remapped cache-line contents are written back to the new replacement memory. If the computer system is shutdown during a planned maintenance, then the contents of the memory locations (both good main and fail-over cache) that need to be saved are written to, for example, a hard disk storage system. Once the main memory having the hard failure or excessive ECC errors has been replaced, the appropriate fail-over memory status bit is reset and the associated cache-line becomes available to the cache controller for accepting new information (cache-line replacement).

An embodiment of the present invention utilizes a core logic chipset having an integral cache memory and memory controller. The core logic chipset has fail-over circuit logic that receives ECC error signals from the memory controller and that sets and clears a fail-over memory status bit associated with each cache-line of the cache memory. When an excessive ECC error signal is received by the fail-over circuit logic, a caching operation is performed on the affected main memory location(s) and the fail-over memory status bit is set. No further activity to the failing main memory occurs and any subsequent memory accesses, either read or write, are made directly and only to the fail-over memory cache-line in the cache memory of the core logic chipset. When the failed or ECC error prone memory is replaced, either through hot plug replacement or during a planned maintenance shutdown, the fail-over circuit logic will reset the fail-over status bit so that the associated cache-line may become available for accepting new information according to the replacement algorithm, and writeback to main memory is re-enabled. The fail-over circuit logic may be implemented in hardware, firmware, software, or any combination thereof.

Another embodiment of the invention utilizes a core logic chipset having an external cache memory, and internal cache and main memory controllers. The core logic chipset has a fail-over circuit as described above and performs similar functions as disclosed above. The external cache memory may be used in conjunction with an internal to the core logic chipset cache memory which may operate as strictly conventional cache memory or may serve the dual purpose of being a fail-over backup to the external cache memory which may be used in this embodiment as the fail-over memory. The internal and external cache memories may have error detection and correction circuits just like the main memory. Typically, cache memory comprises static random access memory (SRAM) which is usually more robust and reliable than main memory which typically comprises dynamic random access memory (DRAM).

Yet another embodiment of the invention utilizes a core logic chipset adapted for controlling a cache memory in a microprocessor. The core logic chipset has a fail-over circuit as described above and performs similar functions as disclosed above. The microprocessor cache memory, integrated with the microprocessor, may be used as the fail-over memory in computer systems not having or requiring cache memory in the core logic chipset or having cache memory external to the core logic chipset. The processor cache memory may be used in conjunction with a cache memory internal to the core logic chipset and/or a cache memory external to the core logic chipset. The processor cache memory may serve the dual purpose of being a fail-over backup to the internal and/or external cache memory which may also be used in this embodiment as fail-over memory. The processor cache memory may have error detection and correction circuits just like the main memory. It is contemplated and within the scope of the present invention that a plurality of processors may be utilized with the embodiments of the invention disclosed herein. The microprocessor cache memory may also have an memory controller integrated in the microprocessor package.

It is also contemplated and within the scope of the present invention that any or all of a plurality of cache memories located in the microprocessor(s), in the core logic chipset, and/or cache memory external to the core logic chipset may store failing memory locations and may migrate these cache-lines containing the failing memory locations between the various cache memories of the computer system. For example, failing memory locations may be initially stored in a plurality of cache-lines of microprocessor cache memory but it would be more advantageous to store these failing memory locations in cache memory external to core logic chipset because the external cache memory has a larger memory capacity than does the microprocessor cache memory. The embodiments of the present invention may write the contents of the cache-lines of a first cache memory being used as fail-over memory to corresponding cache-lines of a second cache memory and then set the corresponding fail-over memory status bit(s) of the second cache memory. Once the contents of the first cache memory have been successfully transferred to the second cache memory, the corresponding fail-over memory status bit(s) of the first cache memory may be reset. This operation is also possible between the second and third cache memories, etc.

When the processor and memory controller are independent, additional handshaking signals/messages may be needed for read and/or write operations. The processor would need to keep the cache-line to be written to memory in its cache until an acknowledgement has been received from the memory controller. In multi-processor systems where the processors and memory controller are independent, the aforementioned handshaking signals/messages are necessary as well as support for migrating cache-lines (described above) used for fail-over memory. If a processor has a cache-line that has been marked as fail-over memory (by setting the corresponding fail-over memory status bit), then when another processor requests ownership of the cache-line, ownership as well as the fail-over memory status must be passed. This is due to the MESI protocol where ownership of a cache-line is allowed to migrate. To ensure that the migrating fail-over memory is never lost, the fail-over memory status bit is also passed.

In conjunction with the embodiments disclosed above, the present invention may also comprise circuit logic and software for determining in a memory fail-over mode whether a memory location is failing by determining if a fault (error) is detected. Logging the address of the memory location having the error. Determining whether the error exceeds a predefined threshold, and if so, indicating that a memory fail-over has been initiated. Analyzing which memory module requires replacement. Mapping the memory module contents to be failed-over to a cache-line of the cache memory. Setting the cache-line fail-over memory status bit to prevent the cache-line from being written over. Replacing the failed memory module with a new memory module. Notifying the computer system that a new memory module has replaced the faulty memory module. Writing the fail-over cache-line back to the newly replaced memory module, and resetting the cache-line fail-over memory status bit so that the associated cache-line may be used again by the cache-line replacement algorithm.

An advantage of the present invention is that the contents of a faulty memory location(s) may fail-over to a cache-line of cache memory without disturbing the normal operation of the computer system, requiring specially designed memory modules, or modifying the operating system software or drivers.

Another advantage is that using cache memory allows the computer system to always have the same memory size to operate from without having to reboot the computer system and then having less main memory to work from.

Still another advantage is using SRAM of the cache memory as fail-over memory which is generally more robust and reliable than DRAM of the main memory.

Still another advantage is a performance boost from the cache memory during normal operation of the computer system.

Yet another advantage is that no portion of main memory need be reserved for standby memory.

A feature of the present invention is that standard memory modules may be utilized.

Another feature is that the fail-over cache memory may be located within the core logic chipset.

Another feature is that the fail-over cache memory may be located external to the core logic chipset.

Still another feature is that the fail-over cache memory may be located within a processor(s) of the computer system.

Still another feature is that LEDs may be used to indicate the location and status of faulty and/or new memory modules.

Other and further features and advantages will be apparent from the following description of presently preferred embodiments of the invention, given for the purpose of disclosure and taken in conjunction with the accompanying drawings.

DETAILED DESCRIPTION OF PREFERRED EMBODIMENTS

Figure 1:
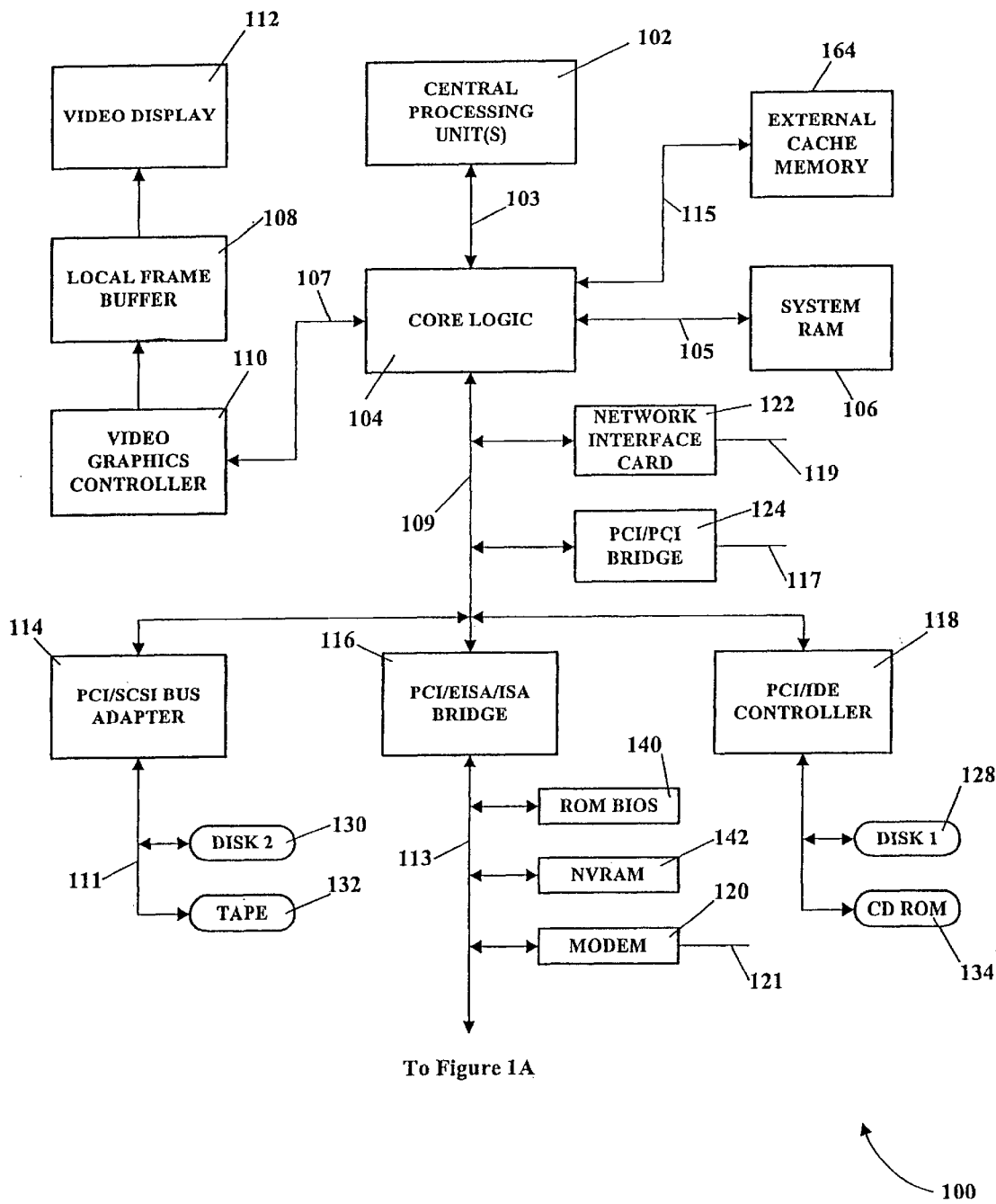
FIGS. 1 and 1A are a schematic block diagram of a computer system according to the present invention.

The present invention is a system, method and apparatus in a computer to automatically fail-over a defective (bad or failing) memory location(s) from one or more memory modules to cache memory while the computer system is running and without having to reboot the computer system. The memory modules may be for example but not limitation, single-in-line or dual-in-line memory modules (SIMM or DIMM, respectively) and RAMBUS in-line memory modules (RIMM), all comprising dynamic random access memory (DRAM). Once a memory location fails over to cache memory, that memory location and its associated memory locations comprising a cache-line of the cache memory are held in the cache memory until the defective memory module(s) is replaced during a planned maintenance shutdown or by hot swapping the defective memory module(s) with a good one.

For illustrative purposes, preferred embodiments of the present invention are described hereinafter for computer systems utilizing the Intel x86 microprocessor architecture and certain terms and references will be specific to that processor platform. It will be appreciated by those skilled in the art of computer systems that the present invention may be adapted and applied to any computer platform having RAM. The RAM may comprise industry standard single-in-line-memory modules (SIMM), dual-in-line-memory modules (DIMM), RAMBUS in-line memory modules (RIMM) and the like.

Referring now to the drawings, the details of preferred embodiments of the present invention are schematically illustrated. Like elements in the drawings will be represented by like numbers, and similar elements will be represented by like numbers with a different lower case letter suffix.

Figure 1A:
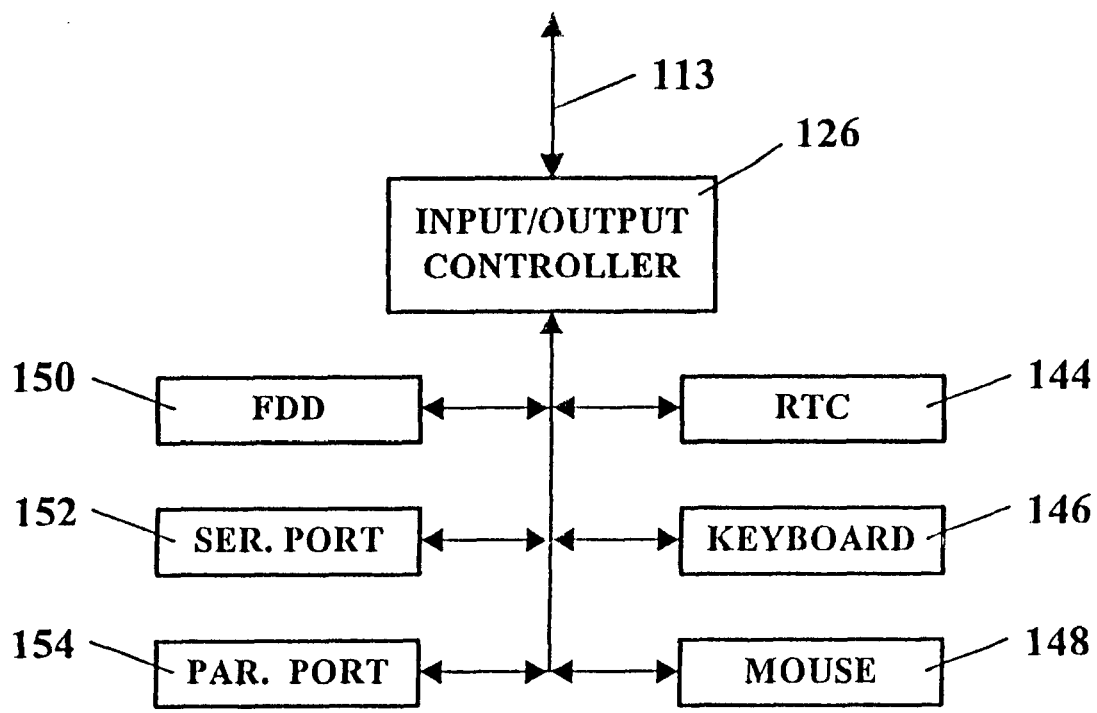

Referring now to FIGS. 1 and 1A, a schematic block diagram of a computer system utilizing embodiments of the present invention is illustrated. A computer system is generally indicated by the numeral 100 and comprises a central processing unit(s) (CPU) 102, core logic 104, system random access memory ("RAM") 106, a video graphics controller 110, a local frame buffer 108, a video display 112, a PCI/SCSI bus adapter 114, a PCI/EISA/ISA bridge 116, and a PCI/IDE controller 118. The CPU 102 may be a plurality of CPUs 102 in a symmetric or asymmetric multi-processor configuration. The video graphics controller 110 may be an AGP device (illustrated) connected to an AGP bus 107 or a PCI device (not illustrated) connected to the PCI bus 109.

The CPU(s) 102 is connected to the core logic 104 through a host bus 103. The system RAM 106 is connected to the core logic 104 through a memory bus 105. The video graphics controller 110 is illustrated connected to the core logic 104 through the AGP bus 107. An external cache memory 164 is connected to the core logic 104 through a cache bus 115. The PCI/SCSI bus adapter 114, PCI/EISA/ISA bridge 116, and PCHDE controller 118 are connected to the core logic 104 through a PCI bus 109. Also connected to the PCI bus 109 are a network interface card ("NIC") 122 and a PCI/PCI bridge 124. Some of the PCI devices such as the NIC 122 and PCI/PCI bridge 124 may plug into PCI connectors on the computer system 100 motherboard (not illustrated).

Hard disk 130 and tape drive 132 may be connected to the PCI/SCSI bus adapter 114 through a SCSI bus 111. The NIC 122 is connected to a local area network 119. The PCI/EISA/ISA bridge 116 connects over an EISA/ISA bus 113 to a ROM BIOS 140, non-volatile random access memory (NVRAM) 142, modem 120, and input-output controller 126. The modem 120 connects to a telephone line 121. The input-output controller 126 interfaces with a keyboard 146, real time clock (RTC) 144, mouse 148, floppy disk drive ("FDD") 150, a serial port 152, and a parallel port 154. The EISA/ISA bus 113 is a slower information bus than the PCI bus 109, but it costs less to interface with the EISA/ISA bus 113. The PCI/IDE controller 118 interfaces hard disk 128 and CD ROM drive 134 to the PCI bus 109.

The system RAM 106 comprises at least one memory module such as, for example but not limitation, SIMM, DIMM, RIMM and the like. The at least one memory module is adapted to plug into a mating connector located on a printed circuit board of the computer system 100. External cache memory 164 and/or internal cache memory 264 (FIG. 2) may be utilized with the various embodiments of the present invention. It is anticipated and within the scope of the present invention that cache memory located on the microprocessor module may also be utilized in an embodiment of the invention.

Figure 2:
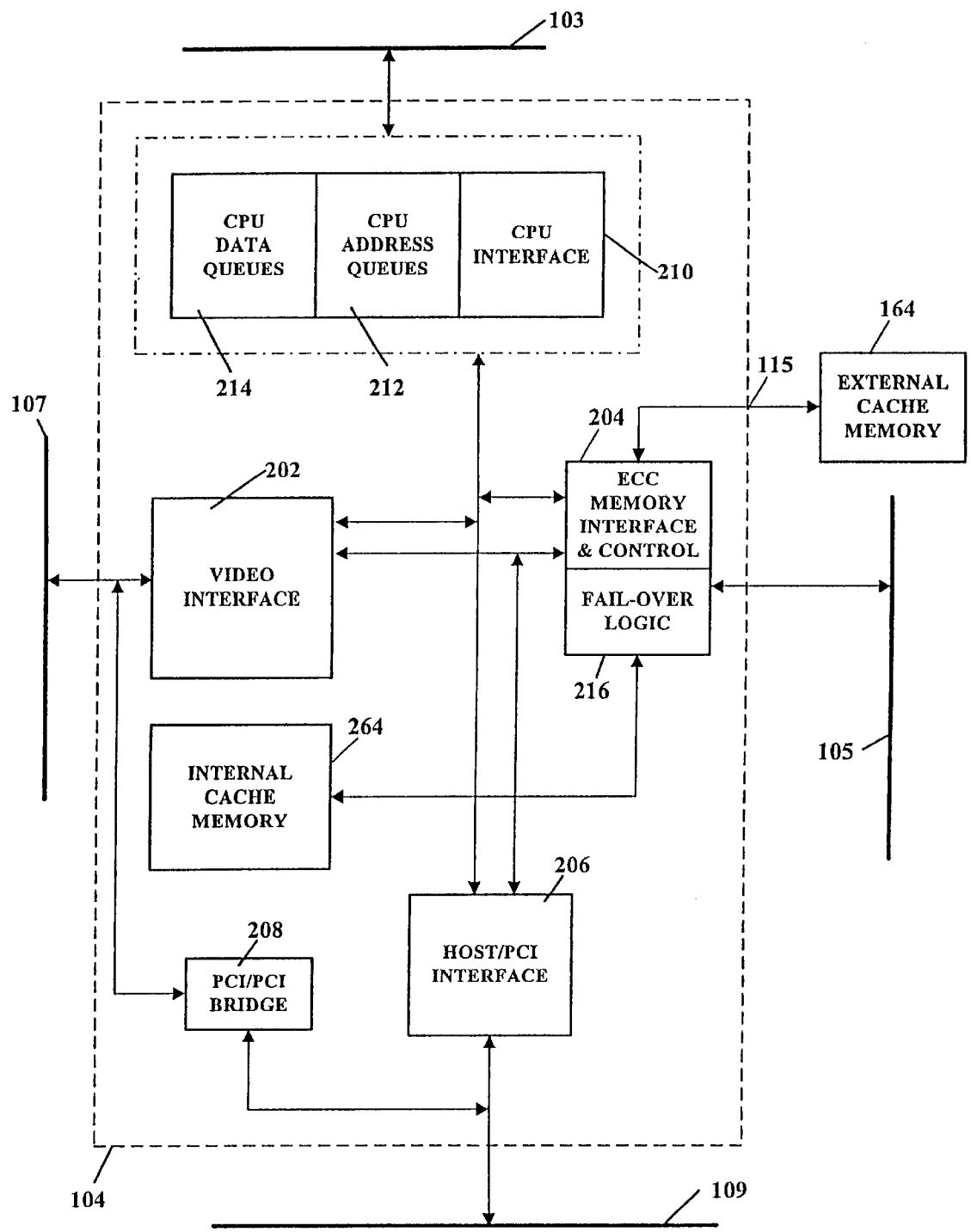
FIG. 2 is a schematic block diagram of a portion of the computer system of FIGS. 1 and 1A.

Referring to FIG. 2 a schematic block diagram of a portion of the computer system of FIGS. 1 and 1A is illustrated. The core logic 104 comprises a video interface 202, ECC memory interface and control 204, fail-over logic 216, a host/PCI interface 206, a PCI/PCI bridge 208, CPU interface 210, CPU address queues 212, and CPU data queues 214. The ECC memory interface and control 204 controls memory transactions, both reads and writes, and also controls the cache memory of the computer system 100. The cache memory may comprise an internal cache memory 264 and/or an external cache memory 164. Both internal and external cache memories 264 and 164, respectively, may be used together. Furthermore, the CPU 102 may also include cache memory (not illustrated). Hereinafter, the external cache memory 164 may be additionally referred to as L3 cache, the internal cache memory 264 may be additionally referred to as L2 cache, and the CPU 102 cache may be referred to as L1 cache.

In normal operation of the computer system 100, the CPU 102 accesses data and instructions stored in the system RAM 106 by making a memory request to the ECC memory interface and control 204 which first checks the L2 and/or L3 cache to see if the memory location(s) requested are stored in the cache(s). If the memory request address corresponds to information already stored in the cache from a previous memory access request, then the request is said to be a cache "hit" and the information is obtained from the cache instead of the RAM 106. If the memory request address information is not found in the cache then the request is said to be a cache "miss" and the ECC memory interface and control 204 will perform the requested memory transaction on the RAM 106.

The ECC memory interface and control 204 also performs error checking and correction of the accessed memory locations of the RAM 106, and when an error is detected a correction is made thereto if possible. Too many bit errors in a memory location of the RAM 106 may eventually cause a catastrophic system crash if something is not done beforehand to avert such a disaster. Numerous implementations of backup, redundant and fail-over memory systems have been used and some work exceptionally well for their intended purpose. However, these implementations for enhancing the robustness of the computer system 100 RAM 106 typically require additional, redundant memory which must sit idle until needed. It is an object of the present invention to utilize all available good system memory, and to replace any system memory locations which are detected as defective (bad or failing) with corresponding cache memory locations in a cache-line(s) of the cache memory.

Typically, each memory access is performed on a cache-line of system memory at a time. The information (data and/or instructions) from this memory access is temporarily stored in a cache-line of the cache memory. The cache memory may be the L1, L2 and/or L3 cache. Typically, the L1 cache is associated with the CPU 102 module and is smaller than the L2 cache which may be part of the core logic 104, and the L3 cache may be external (plug-in SRAM SIMM, DIMM or RIMM) and the largest capacity of the three cache memories referenced hereinabove. Associated with each line of cache memory(ies) is a "tag" register which stores the corresponding main memory addresses of which the information stored in the cache-line correspond. Also stored in the tag register may be MESI information for maintaining cache coherency in a multiprocessor environment. A more detailed description of the operation of cache memory is described in commonly owned U.S. patent application Ser. No. 08/775,144, filed Dec. 31, 1996, entitled "Scoreboard for Cached Multi-Thread Processes" by E. David Neufeld, now U.S. Pat. No. 5,974,438, and is hereby incorporated by reference.

Figure 3:
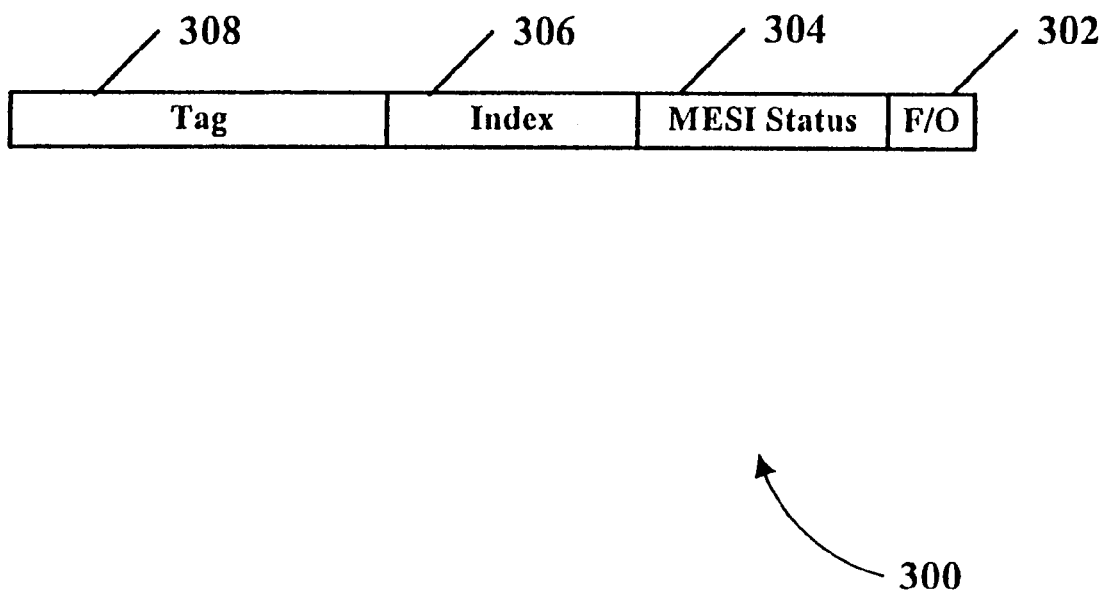
FIG. 3 is a schematic diagram of a cache-line information register, according to embodiments of the present invention.

Referring now to FIG. 3, a schematic diagram of a cache-line information register is illustrated. The cache-line information register is represented generally by the numeral 300. The cache-line information register 300 comprises a tag address portion 308, an index portion 306, a MESI status portion 204, and a fail-over memory status bit 302, according to the embodiments of the present invention. During an access to the RAM 106, the desired information (data and/or instructions) are read from the RAM 106 and stored in a cache-line of the cache memory (storage may be in multiple cache lines of the L1, L2 and/or L3 caches). Whenever a defective memory location or one having an excessive number of errors is detected by the ECC memory interface and control 204 during this main memory (RAM 106) access, the fail-over memory status bit 302 is set by the fail-over logic 216 to indicate that the defective or excess error memory location(s) in the main memory (RAM 106) is now being retained in the cache-line on a more or less permanent basis, i.e., permanent so long as the RAM 106 having the defective location(s) is not replaced by a properly working memory module.

Once the fail-over memory status bit 302 is set for a respective cache-line of the cache memory, the contents of that cache-line become protected from being written over by newer subsequent cached information (i.e., not available for overwriting by the cache replacement algorithm). According to the embodiments of the present invention, the associated main memory locations (defective) effectively become inoperative as far as the computer system is concerned because the information (data and instructions) thereof are now being "permanently" stored (fail-over memory status bit 302 set)

in a cache-line of the cache memory. So long as the fail-over memory status bit 302 is set, the computer system 100 looks to only the cache-line for all reads and writes on the contents of those defective memory locations stored in the cache-line. The fail-over memory status bit 302 also preferably inhibits any write-back operations to the main memory since none are necessary nor desired. All other functions and software programs run in the computer system without modification. In effect, those portions (cache-lines) of the cache memory that are storing the data and instructions formerly residing in the defective memory locations become functionally equivalent to main memory locations without the computer system hardware or software having to re-map, swap, transfer, etc., to a spare or standby main memory module. No extra main memory is required to be held in reserve nor does a reduction of useable memory address space occur when using the embodiments of the present invention. The only degradation to the computer system is a reduction in the size of cache memory available to be used in cache-line. replacement. The fail-over memory status bit 302 may be one or more bits and may be at any bit location(s) within the cache-line information register 300.

It is contemplated and within the scope of the present invention that the L2 cache may be used as a backup fail-over memory for an L3 cache (if one exists), and a microprocessor L1 cache may be used as a backup fail-over memory for the L2 cache. These additional levels of fail-over memory insure that if a cache memory location goes defective, the embodiments of the present invention may fully backup such a failure.

It is also contemplated and within the scope of the present invention that the L1, L2 and/or L3 caches may store failing memory locations and may migrate the cache-lines containing the failing memory locations between the various cache memories of the computer system. For example, failing memory locations may be initially stored in a plurality of cache-lines of the L1 cache but it would be more advantageous to store these failing memory locations in cache memory (L3) external to core logic chipset because the L3 cache has a larger memory capacity than does the L1 cache. The embodiments of the present invention may write the contents of the cache-lines of a first cache memory being used as fail-over memory to corresponding cache-lines of a second cache memory and then set the corresponding fail-over memory status bit(s) of the second cache memory. Once the contents of the first cache memory have been successfully transferred to the second cache memory, the corresponding fail-over memory status bit(s) of the first cache memory may be reset. This operation is also possible between the second and third cache memories, etc.

When the processor and memory controller are independent, additional handshaking signals/messages may be needed for read and/or write operations. The processor would need to keep the cache-line to be written to memory in its cache until an acknowledgement has been received from the memory controller. In multi-processor systems where the processors and memory controller are independent, the aforementioned handshaking signals/messages are necessary as well as support for migrating cache-lines (described above) used for fail-over memory. If a processor has a cache-line that has been marked as fail-over memory (by setting the corresponding fail-over memory status bit), then when another processor requests ownership of the cache-line, ownership as well as the fail-over memory status must be passed. This is due to the MESI protocol where ownership of a cache-line is allowed to migrate. To ensure that the migrating fail-over memory is never lost, the fail-over memory status bit is also passed.

Figure 4:
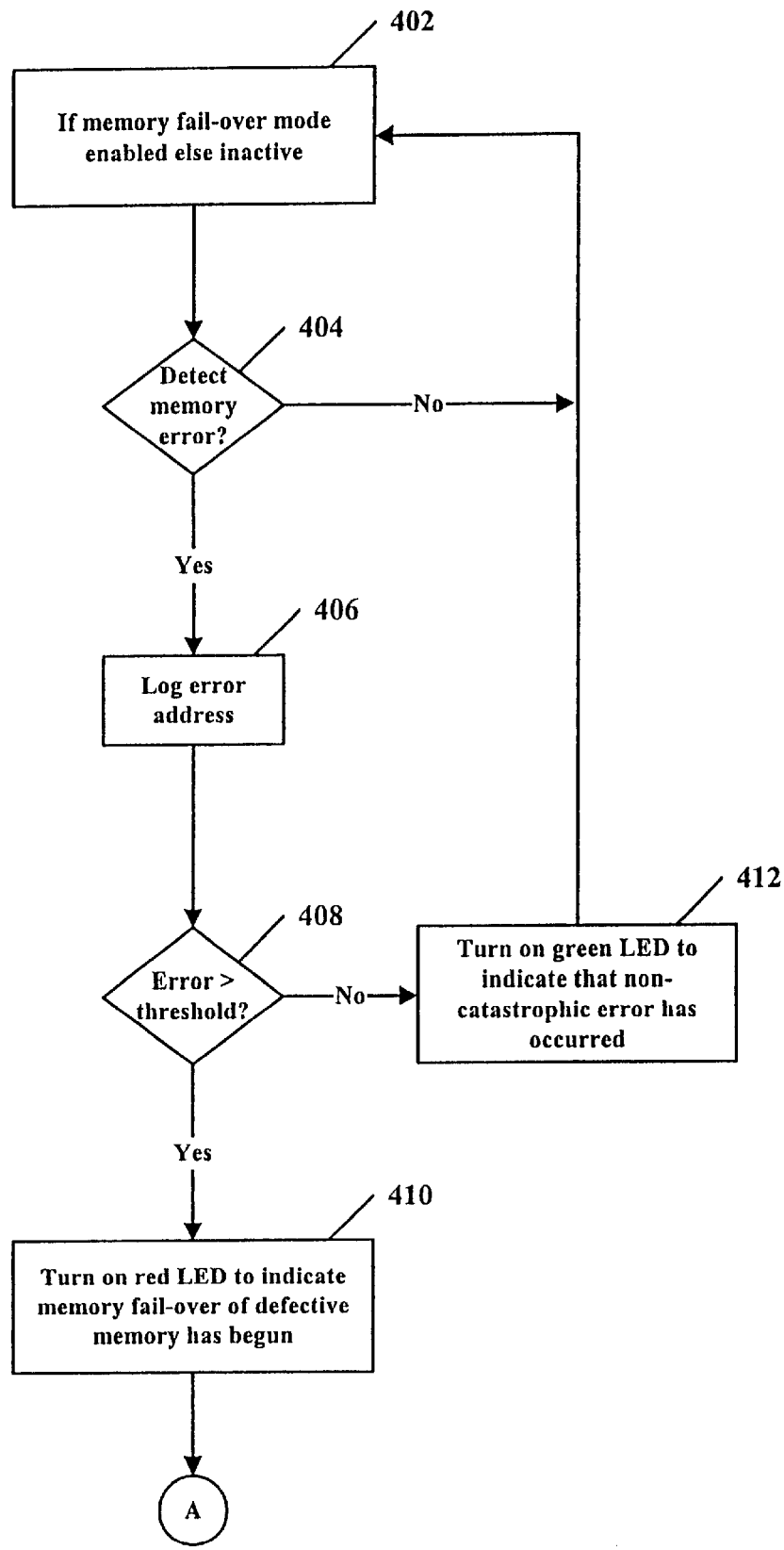
FIGS. 4 and 4A are a schematic flow diagram of an embodiment of the present invention.
Figure 4A:
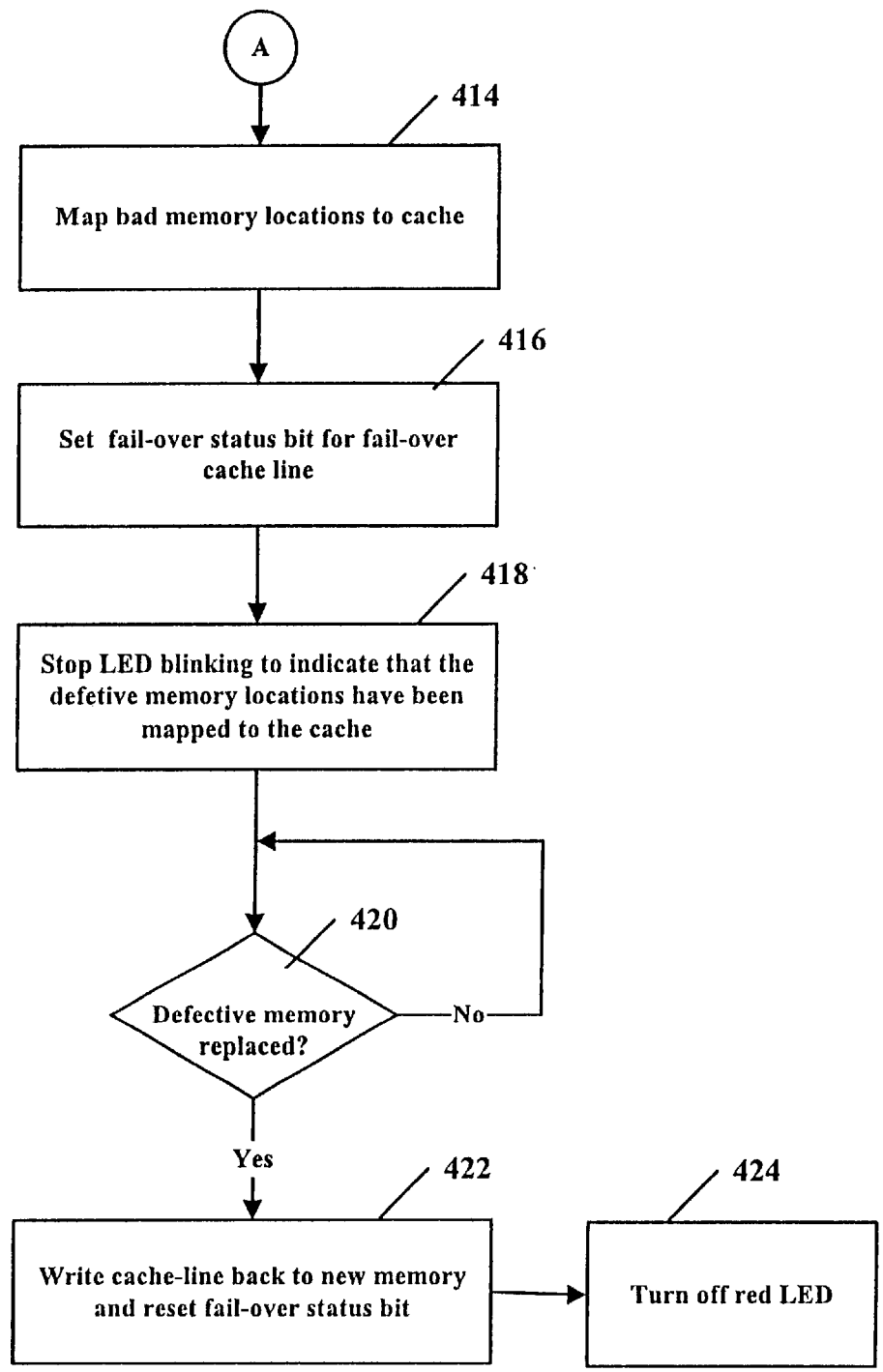

Referring now to FIGS. 4 and 4A, a schematic flow diagram of an embodiment of the present invention is illustrated. In step 402, if the fail-over memory mode of the computer system is enabled, then in step 404, memory fault detection determines if a status signal from the memory controller indicates a memory error. If this status signal is present then in step 406 the memory location address having the error is logged. Next the error log created in step 406 is checked in step 408 to see if the number of errors logged for the memory location address exceeds a predetermined threshold. If the error threshold has not been reached then an indicator such as a green LED is turned on in step 412 to indicate that a non-catastrophic error has occurred in the computer system main memory (RAM 106). However, if the error threshold has been reached then another indicator such as a red or amber LED is turned on in step 410 to indicate the start of a fail-over operation of the defective memory location to cache memory. The red or amber LED may blink to indicate that the fail-over operation is occurring and that the defective memory module should not be replaced until this blinking stops.

In step 414 the contents of the defective memory location(s) is written to a cache-line of the cache memory. An eviction of a modified cache-line may occur prior to step 414. This cache-line may comprise more than one defective memory location and may include good memory locations also, depending on the memory location addresses relative to the cache-line. After the contents of the defective memory location(s) is written to the cache-line, a fail-over status bit is set in step 416 to prevent a cache memory replacement algorithm from writing over this cache-line. The red LED also stops blinking in step 418 to indicate that the defective memory location(s) has been mapped over to the cache-line.

Step 420 determines when the memory module having the defective memory location(s) has been replaced. In step 422, once the a new memory module is detected, the information stored in the cache-line is written back to the same memory location address that the information originally came from. Once the information is written back to the same memory location address, the fail-over status bit is reset and, in step 424, the red LED is turned off. Other combinations of colors and blink rates may be utilized and it is contemplated herein and within the scope of the present invention that any color of light and/or blink rates from the aforementioned status LEDs may be utilized to indicate the different conditions of the main memory and cache memory. One LED having multi-colored light outputs in combination with different blink rates and steady state light outputs may be utilized instead of two or more LEDs for each memory module.

The present invention, therefore, is well adapted to carry out the objects and attain the ends and advantages mentioned, as well as others inherent therein. While the present invention has been depicted, described, and is defined by reference to particular preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A computer system providing automatic fail-over of information stored in memory locations having an undesired number of errors to cache-lines of a cache memory during operation of the computer system, the computer system comprising:

a central processing unit;

a memory controller connected to the central processing unit;

a main memory comprising a plurality of memory locations having information stored therein, wherein the main memory is connected to the memory controller;

memory error detection and correction logic for determining and correcting errors in the information stored in the plurality of memory locations during access of the main memory;

a first cache memory comprising a plurality of first cache-lines and a plurality of first cache tag registers, each of the first cache tag registers being associated with a respective one of the first cache-lines, each of the first cache tag registers comprising an address portion, a status portion and a fail-over memory portion, wherein information is stored in at least one of the first cache-lines of the first cache memory during access of the main memory; and fail-over logic connected to the memory error detection and correction logic and first cache memory, wherein the fail-over logic sets the fail-over memory portion of the first cache tag register associated with the first cache-line storing information from at least one of the plurality of memory locations that has an undesired number of errors detected by the memory error detection and correction logic, and so long as the fail-over memory portion is set, the respective first cache-line cannot be written over during subsequent accesses of the main memory.

2. The computer system of claim 1, wherein said main memory is dynamic random access memory (DRAM).

3. The computer system of claim 1, wherein said first cache memory is static random access memory (SRAM).

4. The computer system of claim 1, further comprising a plurality of central processing units.

5. The computer system of claim 1, wherein the fail-over logic resets the fail-over memory portion of the cache tag register when the at least one of the plurality of memory locations having the undesired number of errors is replaced.

6. The computer system of claim 1, wherein the main memory comprises at least one random access memory module (RAM).

7. The computer system of claim 6, wherein the random access memory module is a single in-line memory module (SIMM).

8. The computer system of claim 6, wherein the random access memory module is a dual in-line memory module (DIMM).

9. The computer system of claim 6, wherein the random access memory module is a RAMBUS dual in-line memory module (RIMM).

10. The computer system of claim 1, further comprising an indicator to indicate when the undesired number of errors is detected, the indicator being controlled by logic connected to the memory error detection and correction logic.

11. The computer system of claim 10, wherein the indicator is a light emitting diode (LED).

12. The computer system of claim 10, wherein the indicator is a message on a computer administrator display.

13. The computer system of claim 1, wherein the memory error detection and correction logic and fail-over logic are part of a core logic chipset.

14. The computer system of claim 13, wherein the first cache memory is part of the core logic chipset.

15. The computer system of claim 1, wherein the memory error detection and correction logic and fail-over logic are part of the central processing unit.

16. The computer system of claim 15, wherein the first cache memory is part of the central processing unit.

17. The computer system of claim 13, further comprising a second cache memory.

18. The computer system of claim 17, wherein the second cache memory is part of the core logic chipset.

19. The computer system of claim 17, wherein the second cache memory is part of the central processing unit.

20. The computer system of claim 17, wherein the second cache memory comprises:

a plurality of second cache-lines and a plurality of first cache tag registers, each of the second cache tag registers being associated with a respective one of the second cache-lines, each of the second cache tag registers comprising an address portion, a status portion and a fail-over memory portion, wherein information is stored in at least one of the second cache-lines of the first cache memory during access of the first cache memory; and the fail-over logic connected to the memory error detection and correction logic and second cache memory, wherein the fail-over logic sets the fail-over memory portion of the second cache tag register associated with the second cache-line storing information from at least one of the first cache-lines that has an undesired number of errors detected by the memory error detection and correction logic, and so long as the fail-over memory portion is set, the respective second cache-line cannot be written over during subsequent accesses of the first cache memory.

21. The computer system of claim 1, further comprising a third cache memory associated with the central processing unit.

22. The computer system of claim 1, further comprising a hard disk drive, a floppy disk drive, a CD ROM, a modem, a keyboard, a video controller and monitor, a mouse, a real time clock, a serial port, a parallel port, and a network interface card.

23. A core logic chipset, comprising:

a host bus interface adapted for connection to a central processing unit;

a memory controller adapted for connection to a main memory comprising a plurality of memory locations having information stored therein;

memory error detection and correction logic for determining and correcting errors in the information stored in the plurality of memory locations during access of the main memory;

a cache memory comprising a plurality of cache-lines and a plurality of cache tag registers, each of the cache tag registers being associated with a respective one of the cache-lines, each of the cache tag registers comprising an address portion, a status portion and a fail-over memory portion, wherein information is stored in at least one of the cache-lines of the cache memory during access of the main memory; and fail-over logic connected to the memory error detection and correction logic and cache memory, wherein the fail-over logic sets the fail-over memory portion of the cache tag register associated with the cache-line storing information from at least one of the plurality of memory locations that has an undesired number of errors detected by the memory error detection and correction logic, and so long as the fail-over memory portion is set, the respective cache-line cannot be written over during subsequent accesses of the main memory.

24. A method in a computer system for providing automatic fail-over of information stored in memory locations having an undesired number of errors to cache-lines of a cache memory during operation of the computer system, the method comprising the steps of:

detecting an error in information read from a memory location in a main memory;

determining if the memory location has an undesired number of errors, wherein if the memory location has the undesired number of errors, then writing the information to a first cache-line of a first cache memory, and setting a first fail-over status bit associated with the first cache-line so as to prevent the first cache-line from being written over during subsequent cache-line replacements, and if the memory location does not have the undesired number of errors, then writing the information to the first cache-line of the first cache memory without setting the first fail-over status bit.

25. The method of claim 24, further comprising the step of activating a first indicator representing an occurrence of the information error.

26. The method of claim 24, further comprising the step of activating a second indicator representing an occurrence of the undesired number of errors.

27. The method of claim 24, further comprising the step of activating a third indicator representing a transfer of the information in the memory location having the undesired number of errors to the cache-line.

28. The method of claim 24, further comprising the step of replacing a portion of the main memory containing the memory location of the information having the undesired number of errors with a new portion of memory.

29. The method of claim 28, further comprising the step of writing back the information stored in the cache-line to the new portion of main memory and resetting the fail-over status bit associated with the cache-line.

30. The method of claim 29, further comprising the step of de-activating the second indicator.

31. The method of claim 24, further comprising the step of alerting an operator when the memory location has an undesired number of errors.

32. The computer system of claim 1, further comprising a plurality of cache memories, each of said plurality of cache memories comprising a plurality of cache-lines and a plurality of cache tag registers, each of the plurality of cache tag registers being associated with a respective one of the plurality of cache-lines, each of the plurality of cache tag registers comprising an address portion, a status portion and a fail-over memory portion, wherein information is stored in at least one of the plurality of cache-lines of a one of the plurality of cache memories during access of the main memory, wherein said fail-over logic sets the fail-over memory portion of the cache tag register associated with the at least one of the plurality of cache lines of the one of the plurality of cache memories.

33. The computer system of claim 32, further comprising logic for migrating information stored in at least one cache-line of the one cache memory to a cache line of another one of the plurality of cache memories and setting the fail-over memory portion of the cache tag register associated with the another one of the plurality of cache memories.

34. The computer system of claim 33, wherein the fail-over memory portion of the cache tag register of the at least one cache-line is reset when the fail-over memory portion of the cache tag register of the another one of the plurality of cache memories is set.

35. The method of claim 24, further comprising the step of logging the memory location of the information having the undesired number of errors.

36. The method of claim 24, further comprising the step of migrating the information stored in the first cache-line of the first cache memory having the associated first fail-over status bit set to a second cache-line of a second cache memory and setting a second fail-over status bit associated with the second cache-line.

37. The method of claim 36, wherein the first fail-over status bit is reset when the second fail-over status bit is set.

38. The method of claim 36, further comprising the step of migrating the information stored in the second cache-line of the second cache memory having the associated second fail-over status bit set to a third cache-line of a third cache memory and setting a third fail-over status bit associated with the third cache-line.

39. The method of claim 38, wherein the second fail-over status bit is reset when the third fail-over status bit is set.

* * * * *